(12) United States Patent
Watanabe et al.

(10) Patent No.: US 12,058,458 B2
(45) Date of Patent: Aug. 6, 2024

(54) IMAGING DEVICE AND IMAGING SYSTEM

(71) Applicant: Sony Semiconductor Solutions Corporation, Kanagawa (JP)

(72) Inventors: Tomoki Watanabe, Kanagawa (JP); Kyoichi Takenaka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/322,185

(22) Filed: May 23, 2023

(65) Prior Publication Data

US 2023/0362510 A1 Nov. 9, 2023

Related U.S. Application Data

(63) Continuation of application No. 17/421,527, filed as application No. PCT/JP2019/049818 on Dec. 19, 2019, now Pat. No. 11,716,553.

(30) Foreign Application Priority Data

Jan. 15, 2019 (JP) ................................. 2019-004168

(51) Int. Cl.
*H04N 25/709* (2023.01)
*H04N 17/00* (2006.01)
(Continued)

(52) U.S. Cl.
CPC ......... *H04N 25/709* (2023.01); *H04N 17/002* (2013.01); *H04N 25/767* (2023.01); *H04N 25/772* (2023.01); *H04N 25/75* (2023.01)

(58) Field of Classification Search
CPC .. H04N 25/709; H04N 17/002; H04N 25/767; H04N 25/772; H04N 25/75; H03M 1/10; H03M 1/56; H03M 1/74
See application file for complete search history.

(56) References Cited

U.S. PATENT DOCUMENTS 9,912,883 B1 * 3/2018 Lee .................. H03M 1/56
2006/0250114 A1 11/2006 Faberman
(Continued)

FOREIGN PATENT DOCUMENTS

| CN | 106257838 A | 12/2016 |
|----|-------------|---------|
| JP | H07-46129 A | 2/1995 |

(Continued)

OTHER PUBLICATIONS

International Search Report (PCT/ISA/210), International Application No. PCT/JP2019/049818, dated Jan. 30, 2020. **.

(Continued)

*Primary Examiner* — Michael E Teitelbaum
(74) *Attorney, Agent, or Firm* — Michael Best & Friedrich LLP

(57) ABSTRACT

An imaging device according to an embodiment of the present disclosure includes: a plurality of current sources including first group current sources and second group current sources; and a control unit that controls driving of the first group current sources to generate a first-phase ramp voltage and controls driving of the first group current sources and at least one current source of the second group current sources to generate a second-phase ramp voltage.

12 Claims, 12 Drawing Sheets

(51) Int. Cl.
*H04N 25/75* (2023.01)
*H04N 25/767* (2023.01)
*H04N 25/772* (2023.01)

(56) References Cited

U.S. PATENT DOCUMENTS

| | | |
|---|---|---|
| 2007/0194962 A1 | 8/2007 | Asayama |
| 2011/0279723 A1 | 11/2011 | Takamiya et al. |
| 2012/0119063 A1 | 5/2012 | Takamiya et al. |
| 2019/0166323 A1* | 5/2019 | Saito .................. G06T 7/55 |

FOREIGN PATENT DOCUMENTS

| | | |
|---|---|---|
| JP | 2006121615 A | 5/2006 |
| JP | 2010154562 A | 7/2010 |
| JP | 2011259407 A | 12/2011 |
| JP | 2017060383 A | 3/2017 |
| JP | 2012039299 A | 2/2021 |

OTHER PUBLICATIONS

Notification of Transmittal of the International Search Report and the Written Opinion of the International Searching Authority, or the Declaration (PCT/ISA/220), International Application No. PCT/JP2019/049818, dated Feb. 10, 2020. **.

Written Opinion of the International Search Authority (PCT/ISA/237), International Application No. PCT/JP2019/049818, dated Feb. 10, 2020. **.

* cited by examiner

[FIG. 1]
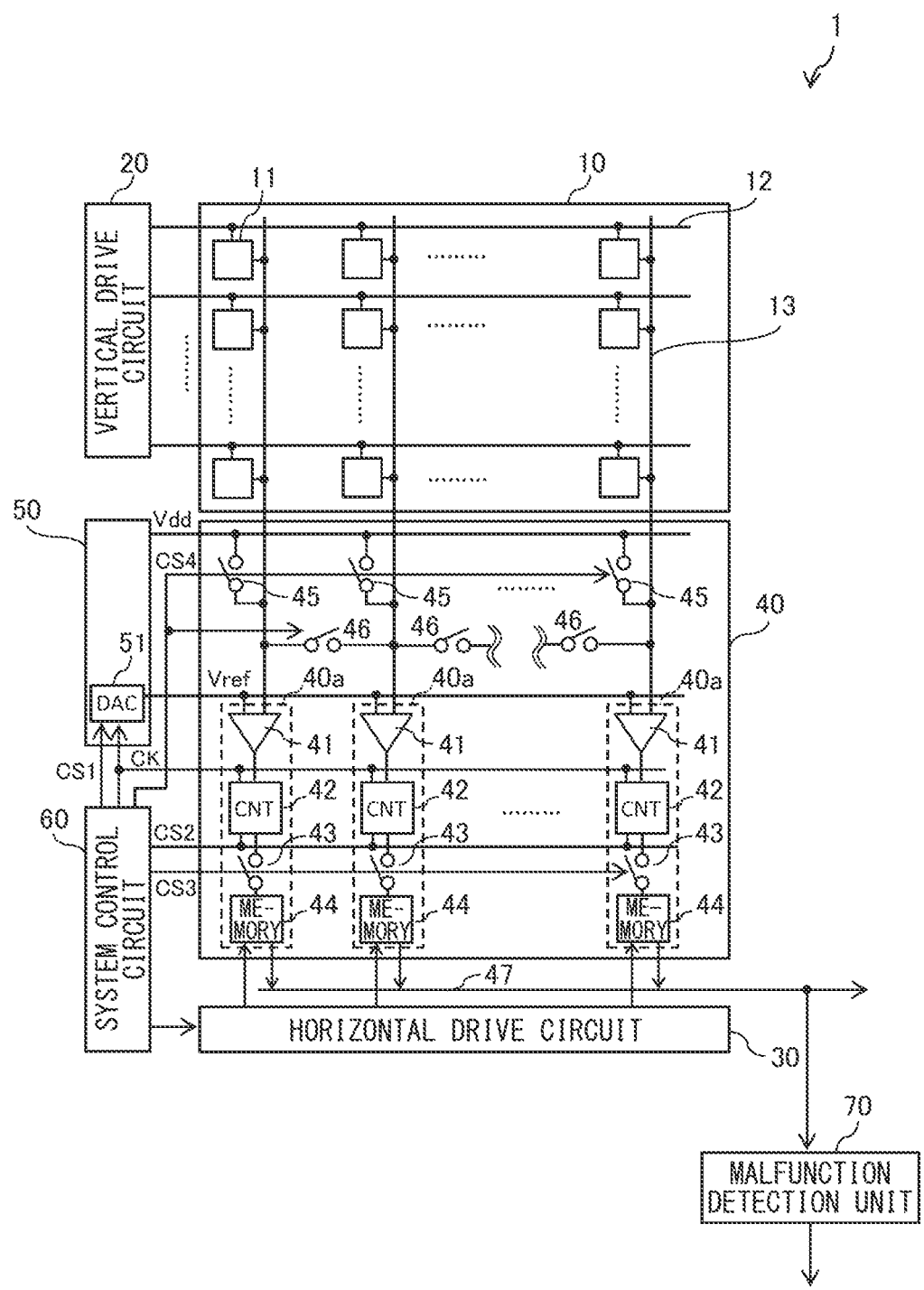

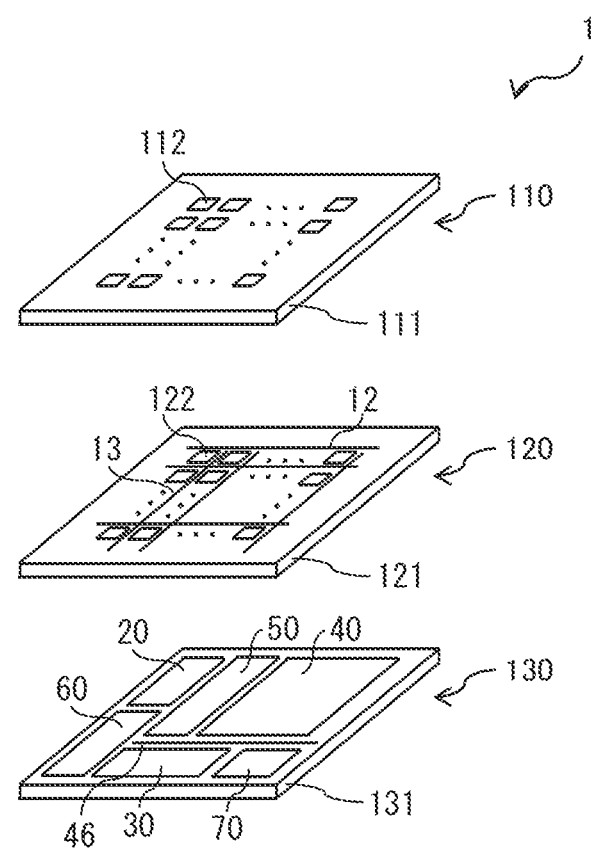
[FIG. 2]

[ FIG. 3 ]
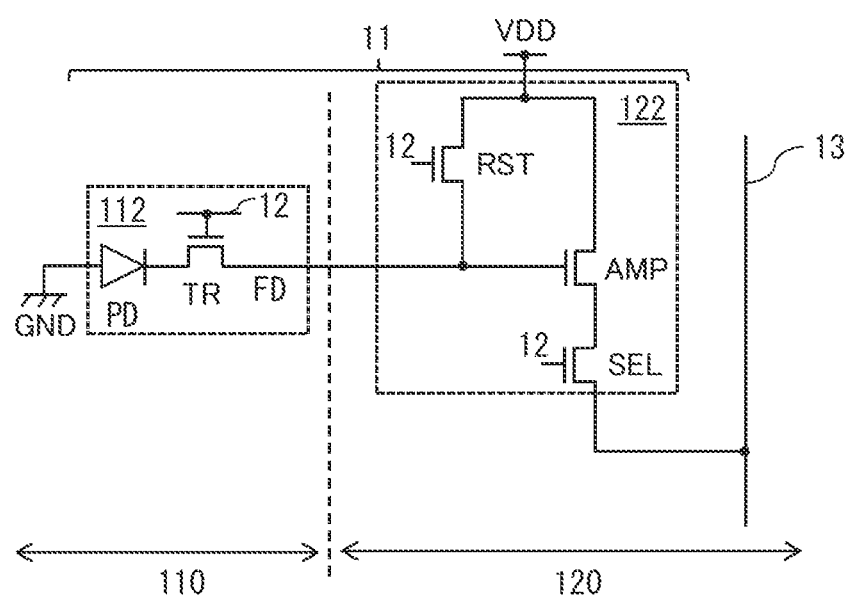

[ FIG. 4 ]
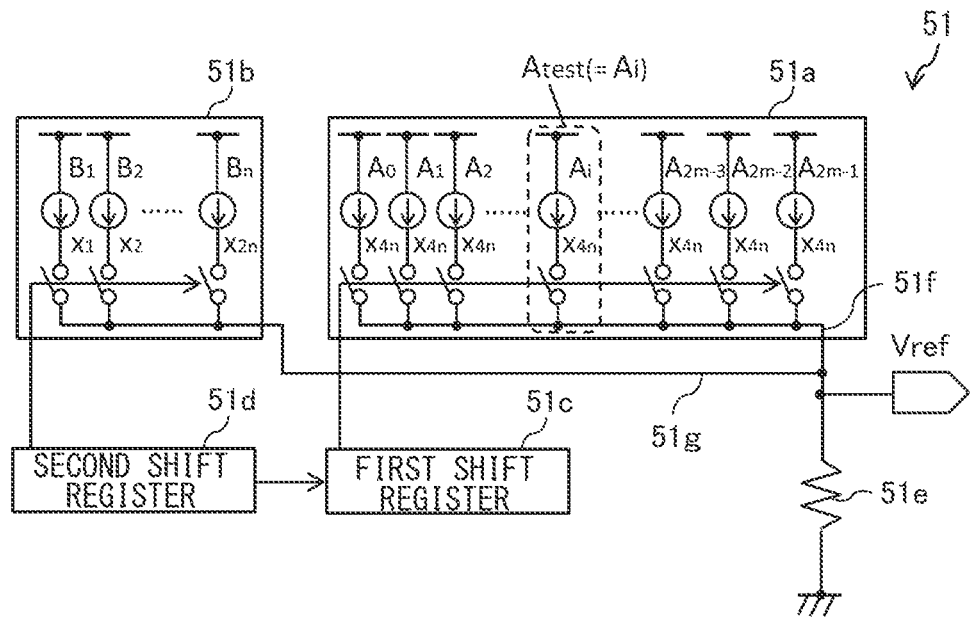
[ FIG. 5 ]
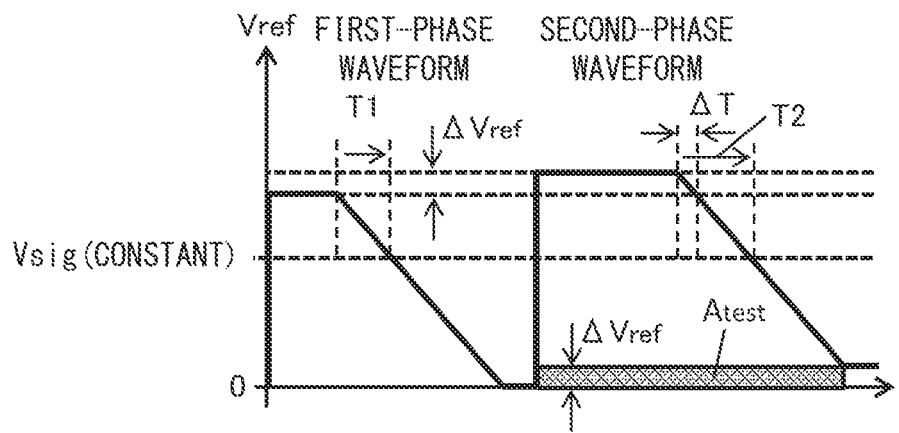

[ FIG. 6 ]
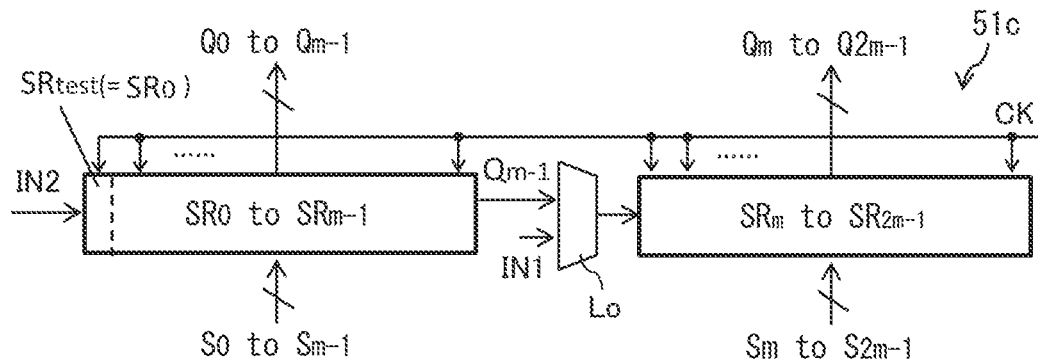
[ FIG. 7 ]
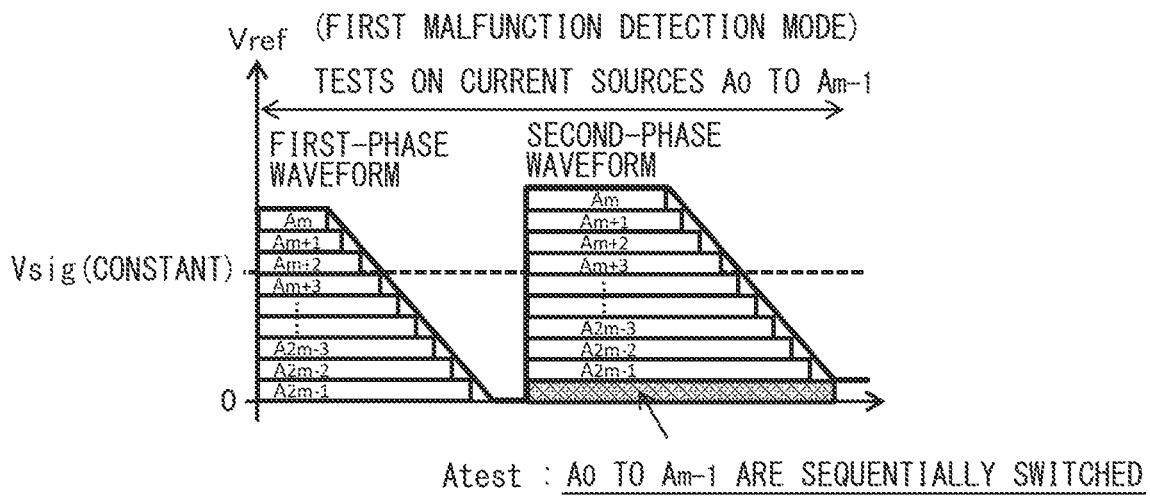

[ FIG. 8 ]
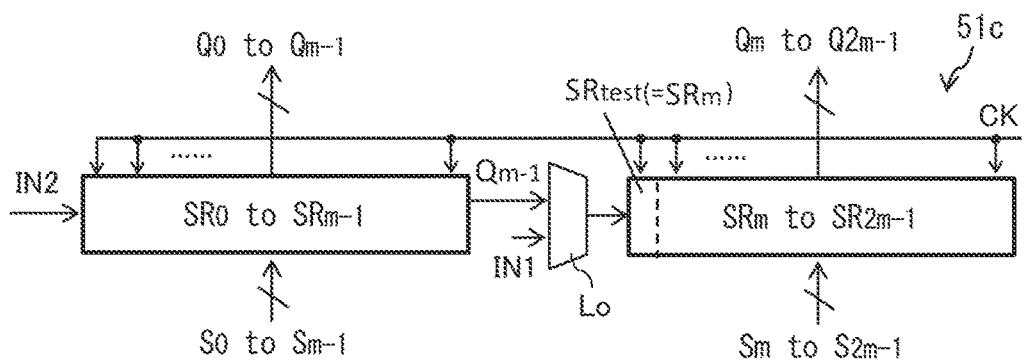
[ FIG. 9 ]
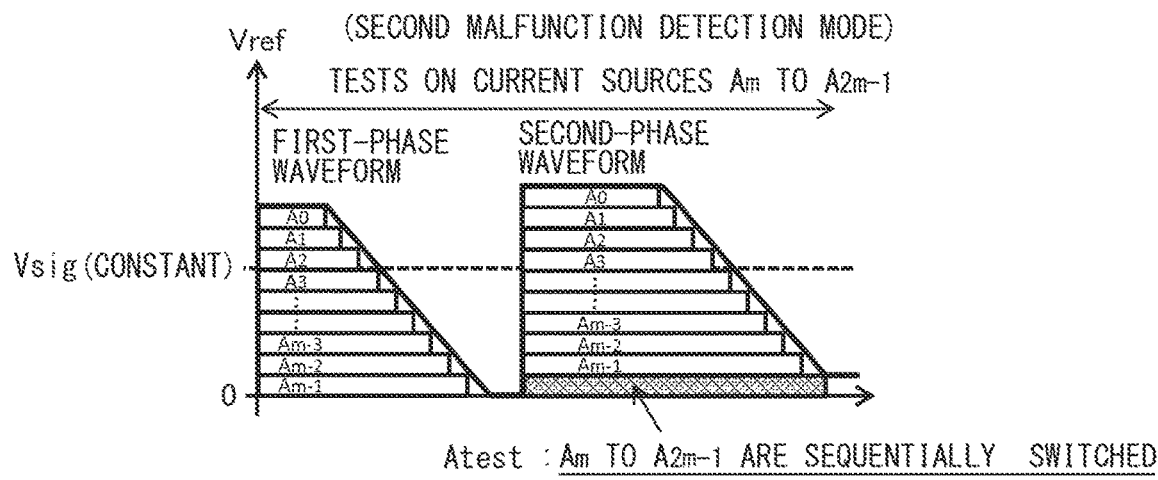

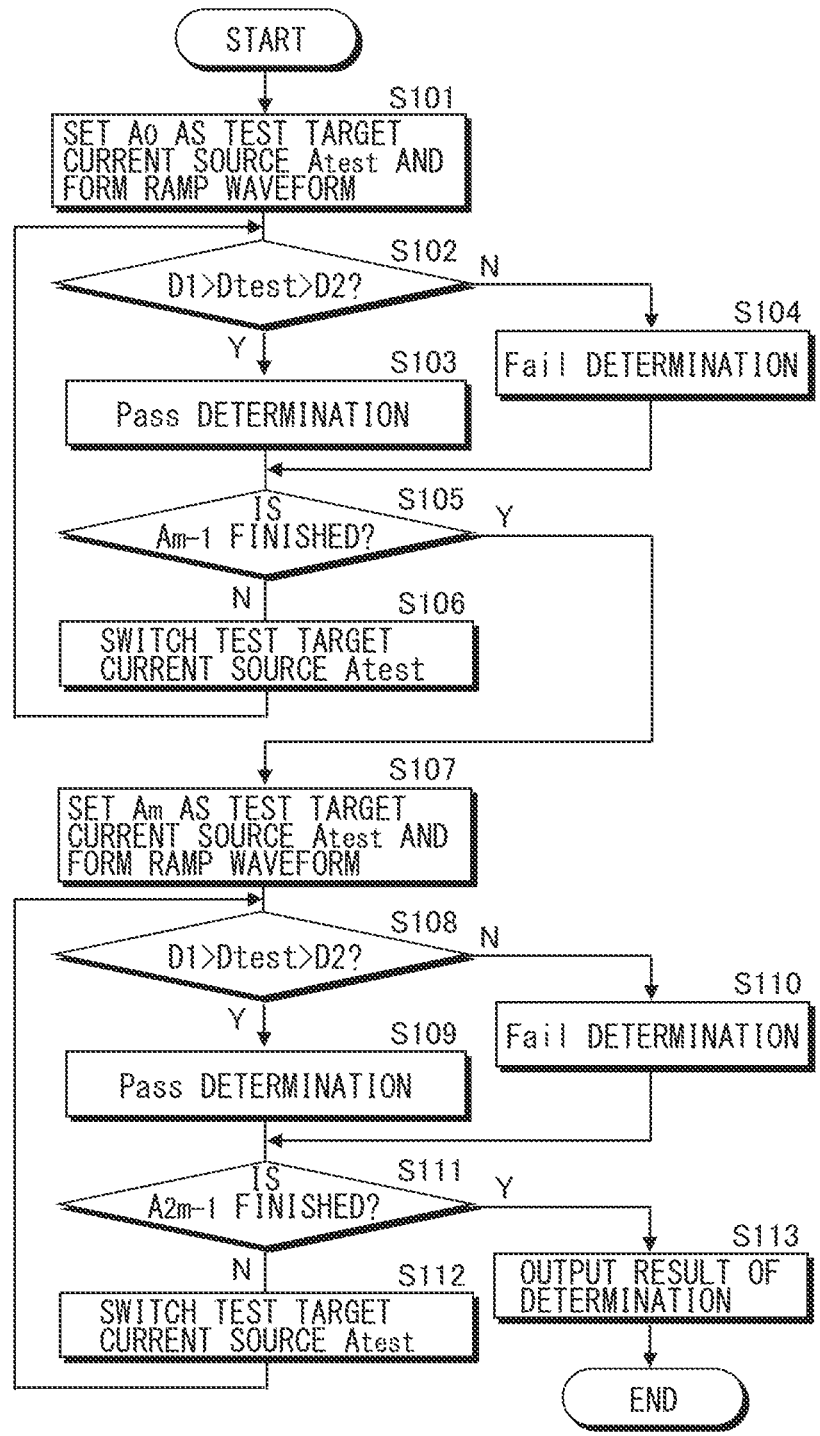
[ FIG. 10 ]

[FIG. 11]
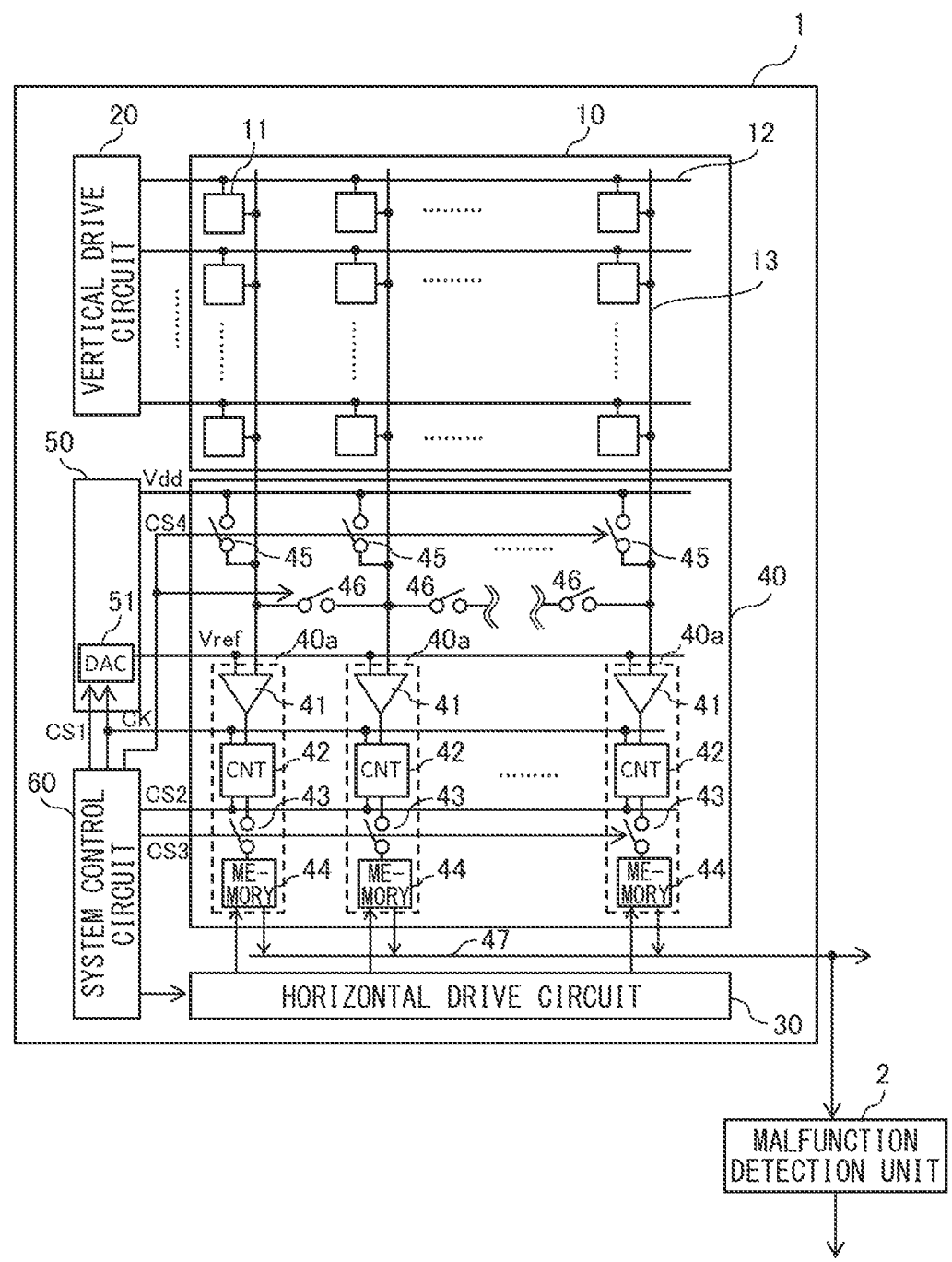

[ FIG. 12 ]
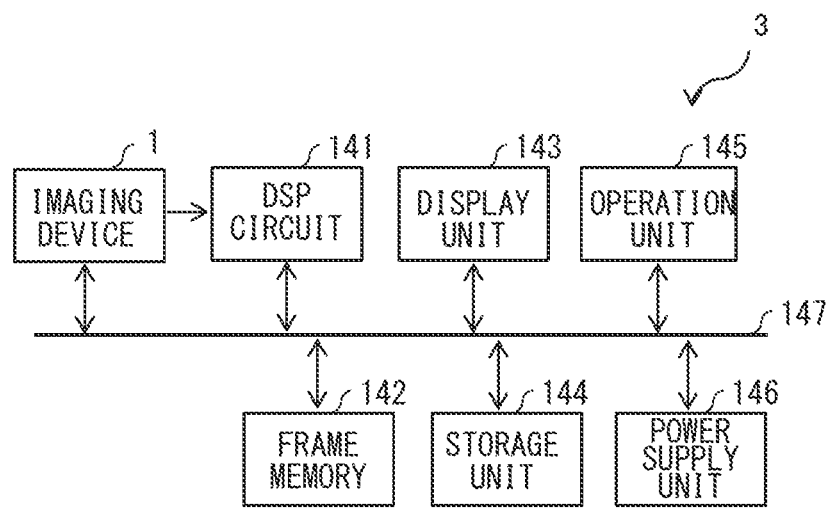
[ FIG. 13 ]
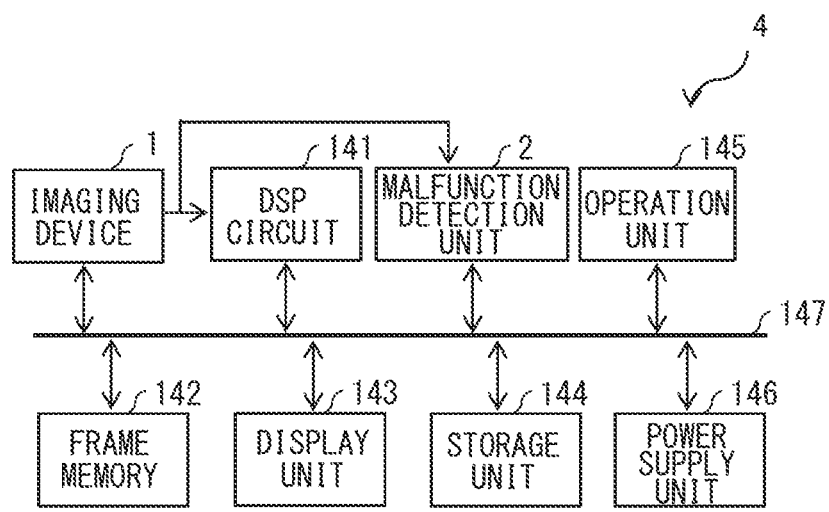

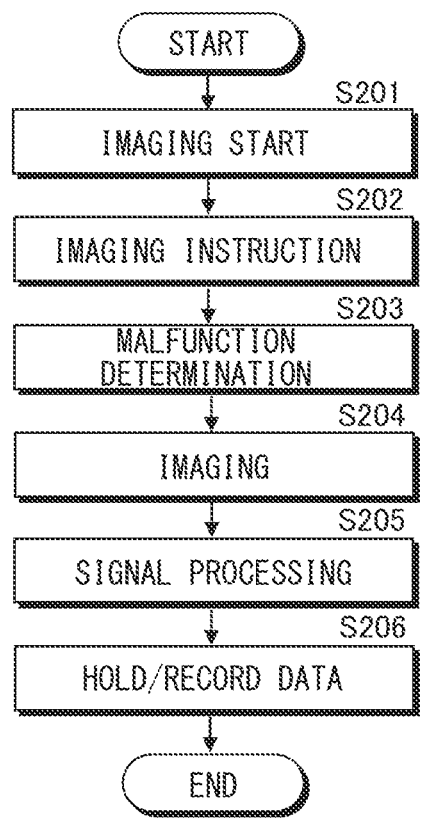
[ FIG. 14 ]

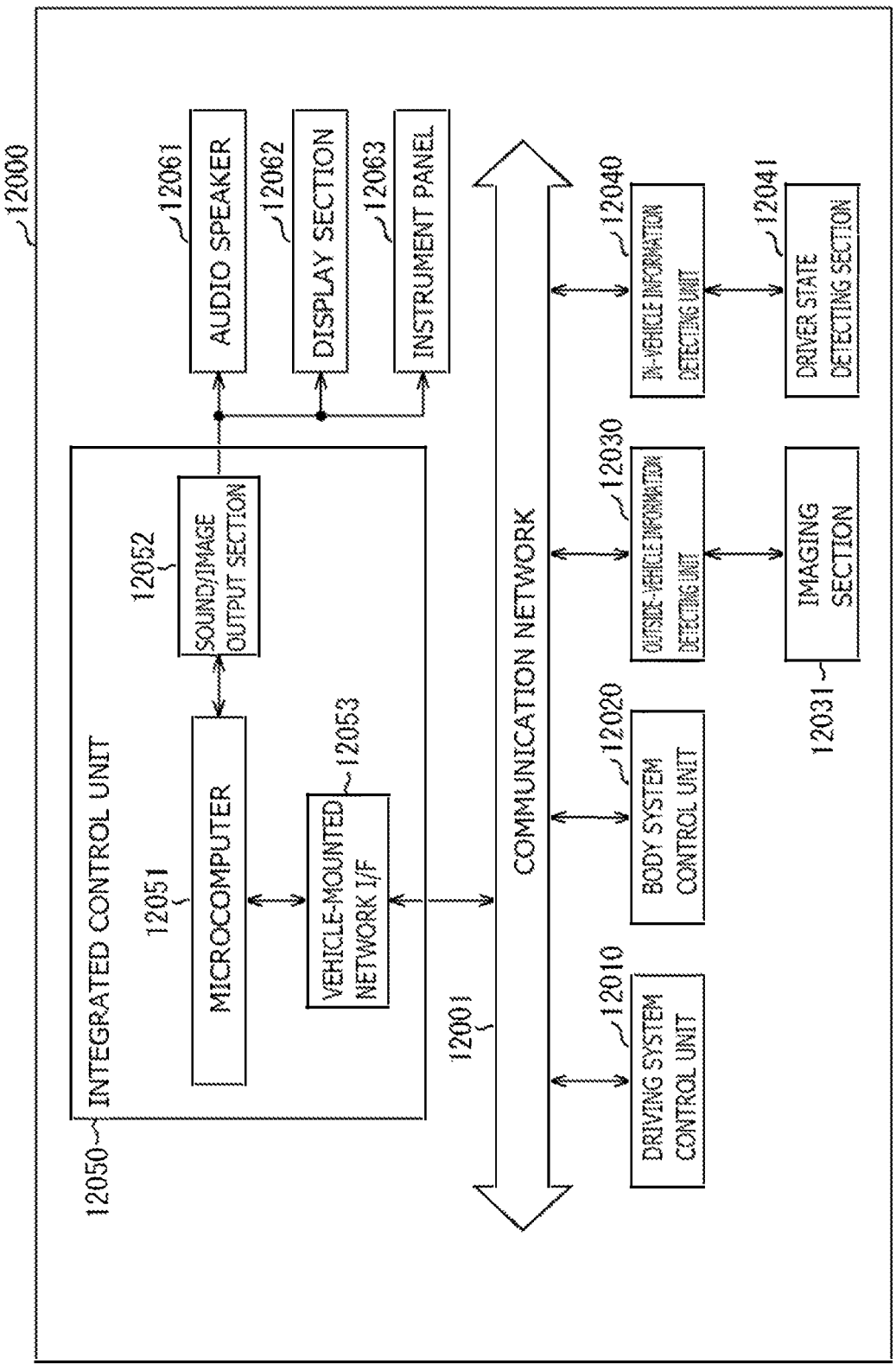
[Fig 15]

[FIG. 16]
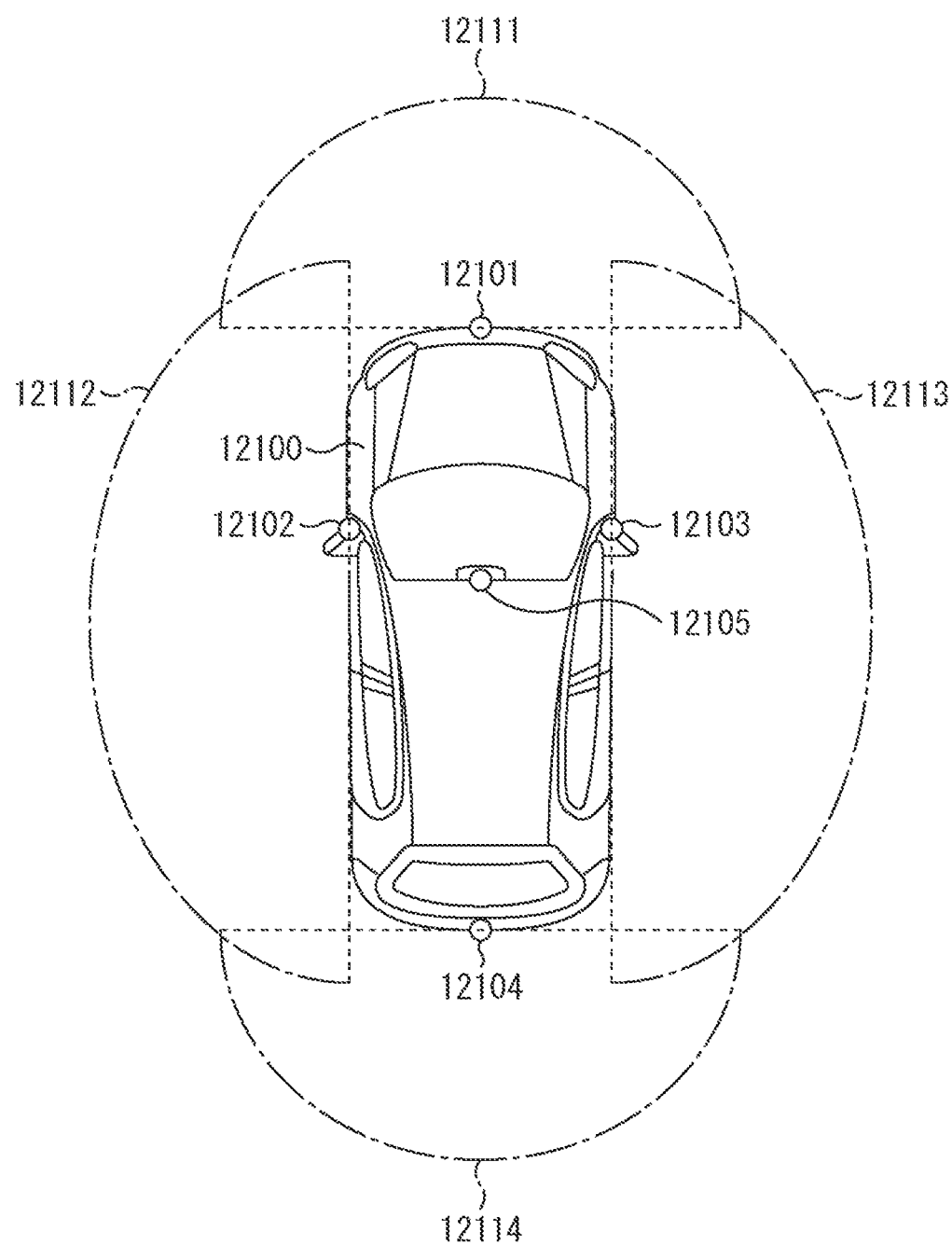

IMAGING DEVICE AND IMAGING SYSTEM

CROSS REFERENCE TO RELATED APPLICATIONS

This application is a continuation application of U.S. application Ser. No. 17/421,527, filed Jul. 8, 2021 which is a 371 Nationalization of Application No. PCT/JP2019/049818 filed Dec. 19, 2019 and claims priority to Japanese Patent Application No. 2019-004168 filed on Jan. 15, 2019 with Japan Patent Office, the entire contents of which are incorporated in this application by reference.

TECHNICAL FIELD

The present disclosure relates to an imaging device and an imaging system.

BACKGROUND ART

ADC (Analog Digital Converter) mounted on an image sensor includes single-slope ADC. DAC (Digital Analog Converter) is frequently used for this single-slope ADC as a ramp voltage generator. An example of DAC architecture includes current segment DAC including several hundreds of current sources. In the current segment DAC, currents generated by performing selective on/off control on the several hundreds of current source flow through resistors, thereby offering a ramp voltage (see PTL 1).

CITATION LIST

Patent Literature

PTL 1: Japanese Unexamined Patent Application Publication No. 2012-39299

SUMMARY OF THE INVENTION

In a case of use where DAC is not allowed to have a malfunction, it is necessary to carry out tests to determine whether several hundreds of current sources each have a malfunction. In general, these tests are carried out at the time of shipment of an image sensor. These tests have been carried out in the past by inputting voltages obtained from the individual current sources to an external inspection device. However, in a case where the voltages obtained from the individual current sources are inputted to the external inspection device, the influence of parasitic RC, a process for increasing the measurement accuracy, or the like tends to increase the test time. It is thus desirable to provide an imaging device and an imaging system each of which makes it possible to shorten the test time.

An imaging device according to an embodiment of the present disclosure includes: a plurality of current sources including first group current sources and second group current sources; and a control unit that controls driving of the first group current sources to generate a first-phase ramp voltage and controls driving of the first group current sources and at least one current source of the second group current sources to generate a second-phase ramp voltage.

In the imaging device according to the embodiment of the present disclosure, the driving of the first group current sources is controlled to generate the first-phase ramp voltage. The driving of the first group current sources and at least one current source of the second group current sources is controlled to generate the second-phase ramp voltage. This makes it possible to detect a malfunction of at least one current source of the second group current sources, for example, on the basis of the first-phase ramp voltage and the second-phase ramp voltage. As a result, it is possible to detect a malfunction of the imaging device even without using the external inspection device. In addition, there is no need to use the external inspection device. This also makes it possible to omit the influence of parasitic RC, the process for increasing the measurement accuracy, or the like.

An imaging system according to an embodiment of the present disclosure includes: a plurality of current sources including first group current sources and second group current sources; and a control unit that controls driving of the first group current sources to generate a first-phase ramp voltage and controls driving of the first group current sources and at least one current source of the second group current sources to generate a second-phase ramp voltage. The imaging system further includes a malfunction detection unit that detects a malfunction of at least one current source of the second group current sources on the basis of the first-phase ramp voltage and the second-phase ramp voltage.

The imaging system according to the embodiment of the present disclosure is provided with the malfunction detection unit that detects a malfunction of at least one current source of the second group current sources on the basis of the first-phase ramp voltage and the second-phase ramp voltage. This makes it possible to detect a malfunction of the imaging device even without using an external inspection device. In addition, there is no need to use the external inspection device. This also makes it possible to omit the influence of parasitic RC, the process for increasing the measurement accuracy, or the like.

BRIEF DESCRIPTION OF DRAWING

FIG. 1 is a diagram illustrating a circuit configuration example of an imaging device according to an embodiment of the present disclosure.

FIG. 2 is a diagram illustrating an example in which the imaging device in FIG. 1 includes three substrates that are stacked.

FIG. 3 is a diagram illustrating a circuit configuration example of a sensor pixel in FIG. 2.

FIG. 4 is a diagram illustrating a circuit configuration example of DAC in FIG. 1.

FIG. 5 is a diagram illustrating an output waveform example of the DAC in FIG. 4.

FIG. 6 is a diagram illustrating a circuit configuration example of a first shift register in FIG. 4.

FIG. 7 is a diagram illustrating an output waveform example of DAC including the first shift register in FIG. 6.

FIG. 8 is a diagram illustrating a circuit configuration example of the first shift register in FIG. 4.

FIG. 9 is a diagram illustrating an output waveform example of the DAC including the first shift register in FIG. 8.

FIG. 10 is a diagram illustrating an example of a malfunction determination procedure by the DAC in FIG. 4.

FIG. 11 is a diagram illustrating a modification example of a circuit configuration of the imaging device in FIG. 1.

FIG. 12 is a diagram illustrating an example of a schematic configuration of an imaging system including the imaging device according to any of the embodiment described above and the modification example thereof.

FIG. 13 is a diagram illustrating an example of a schematic configuration of the imaging system including the imaging device according to any of the embodiment described above and the modification example thereof.

FIG. 14 is a diagram illustrating an example of an imaging procedure by the imaging system in FIGS. 12 and 13.

FIG. 15 is a block diagram depicting an example of schematic configuration of a vehicle control system.

FIG. 16 is a diagram of assistance in explaining an example of installation positions of an outside-vehicle information detecting section and an imaging section.

MODES FOR CARRYING OUT THE INVENTION

The following describes modes for carrying out the present disclosure in detail with reference to the drawings. It is to be noted that description is given in the following order.
1. Embodiment (Imaging Device) . . . FIGS. 1 to 10
2. Modification Example (Imaging Device) . . . FIG. 11
3. Application Example (Imaging System) . . . FIGS. 12 to 14
4. Practical Application Example (Mobile Body) . . . FIGS. 15 and 16

1. Embodiment

[Configuration]

An imaging device 1 according to an embodiment of the present disclosure is described. FIG. 1 illustrates a circuit configuration example of the imaging device 1. FIG. 2 illustrates an example in which the imaging device 1 includes three substrates that are stacked. The imaging device 1 according to the present modification example is a CMOS image sensor mounted with column parallel ADC. The imaging device 1 includes a pixel array unit 10 including a plurality of sensor pixels 11 that is two-dimensionally disposed in a matrix (in the shape of a matrix). The plurality of sensor pixels 11 each includes a photoelectric conversion element. For example, as illustrated in FIGS. 2 and 3, each of the sensor pixels 11 includes a pixel circuit 112 and a readout circuit 122.

The pixel circuit 112 includes, for example, a photodiode PD, a transfer transistor TR, and a floating diffusion FD. The transfer transistor TR is electrically coupled to the photodiode PD. The floating diffusion FD temporarily holds an electric charge outputted from the photodiode PD via the transfer transistor TR. The photodiode PD performs photoelectric conversion to generate an electric charge corresponding to the amount of received light. The cathode of the photodiode PD is coupled to the source of the transfer transistor TR. The anode of the photodiode PD is coupled to a reference potential line (e.g., ground). The drain of the transfer transistor TR is coupled to the floating diffusion section FD. The gate of the transfer transistor TR is coupled to a pixel drive line 12.

In each of the pixel circuits 112, the floating diffusion FD is coupled to the input end of the corresponding readout circuit 122. The readout circuit 122 includes, for example, a reset transistor RST, a selection transistor SEL, and an amplification transistor AMP. The source (input end of the readout circuit 122) of the reset transistor RST is coupled to the floating diffusions FD and the drain of the reset transistor RST is coupled to a power supply line VDD and the drain of the amplification transistor AMP. The gate of the reset transistor RST is coupled to the pixel drive line 12. The source of the amplification transistor AMP is coupled to the drain of the selection transistor SEL and the gate of the amplification transistor AMP is coupled to the source of the reset transistor RST. The source (output end of a readout circuit 22) of the selection transistor SEL is coupled to a vertical signal line 13 and the gate of the selection transistor SEL is coupled to the pixel drive line 12.

In a case where the transfer transistor TR is turned on, the transfer transistor TR transfers an electric charge of the photodiode PD to the floating diffusion FD. The reset transistor RST resets the potential of the floating diffusion FD at a predetermined potential. In a case where the reset transistor RST is turned on, the reset transistor RST resets the potential of the floating diffusion FD at the potential of the power supply line VDD. The selection transistor SEL controls the output timing of a pixel signal from the readout circuit 122. The amplification transistor AMP generates, as a pixel signal, a signal having the voltage corresponding to the level of the electric charge held in the floating diffusion FD. In other words, the amplification transistor AMP generates, as a pixel signal, a signal having the voltage corresponding to the amount of received light by the sensor pixel 11. The amplification transistor AMP is included in an amplifier of a source follower type. The amplification transistor AMP outputs a pixel signal having the voltage corresponding to the level of the electrical charge generated in the photodiode PD. In a case where the selection transistor SEL is turned on, the amplification transistor AMP amplifies the potential of the floating diffusion FD and outputs the voltage corresponding to the potential to a column signal processing circuit 40 via the vertical signal line 13.

It is to be noted that the selection transistor SEL may be provided between the power supply line VDD and the amplification transistor AMP. In this case, the drain of the reset transistor RST is coupled to the power supply line VDD and the drain of the selection transistor SEL. The source of the selection transistor SEL is coupled to the drain of the amplification transistor AMP and the gate of the selection transistor SEL is coupled to the pixel drive line 12. The source (output end of the readout circuit 22) of the amplification transistor AMP is coupled to the vertical signal line 13 and the gate of the amplification transistor AMP is coupled to the source of the reset transistor RST.

The imaging device 1 includes three substrates (a first substrate 110, a second substrate 120, and a third substrate 130). The imaging device 1 is an imaging device that has a three-dimensional structure in which three substrates (the first substrate 110, the second substrate 120, and the third substrate 130) are bonded together. The first substrate 110, the second substrate 120, and the third substrate 130 are stacked in this order.

The first substrate 110 is a substrate including the plurality of pixel circuits 112 on a semiconductor substrate 111. The plurality of pixel circuits 112 each performs photoelectric conversion. The plurality of pixel circuits 112 is provided on the first substrate 110 in a matrix. The second substrate 120 is a substrate including the one readout circuit 122 for each of the pixel circuits 112 on a semiconductor substrate 121. The readout circuit 122 outputs a pixel signal based on an electric charge outputted from the pixel circuit 112. The second substrate 120 includes the plurality of pixel drive lines 12 extending in the row direction and the plurality of vertical signal lines 13 extending in the column direction. The third substrate 130 is a substrate including a logic circuit on a semiconductor substrate 131. The logic circuit processes a pixel signal. The logic circuit includes, for example, a vertical drive circuit 20, a horizontal drive circuit 30, the column signal processing circuit 40, a voltage supply unit 50, a horizontal output line 47, a system control circuit 60, and a malfunction detection unit 70. In other words, the imaging device 1 includes the vertical drive circuit 20, the horizontal drive circuit 30, the column signal processing circuit 40, the voltage supply unit 50, the horizontal output line 47, the system control circuit 60, and the malfunction detection unit 70. The logic circuit outputs a digital value for each of the pixel circuits 112 to the outside.

The system control circuit 60 generates clock signals, control signals, and the like on the basis of a master clock. The system control circuit 60 supplies the clock signals, the control signals, and the like to the vertical drive circuit 20, the horizontal drive circuit 30, the column signal processing circuit 40, the voltage supply unit 50, and the like. The clock signals serve as operational criteria for the vertical drive circuit 20, the horizontal drive circuit 30, the column signal processing circuit 40, the voltage supply unit 50, and the like.

The vertical drive circuit 20 includes, for example, a shift register and the like. The vertical drive circuit 20 controls the row scanning of the plurality of sensor pixels 11 via the plurality of pixel drive lines 12.

The column signal processing circuit 40 performs, for example, a correlated double sampling (Correlated Double Sampling: CDS) process on a pixel signal supplied from each of the sensor pixels 11 in the row selected by the vertical drive circuit 20. The column signal processing circuit 40 performs, for example, a CDS process in an imaging mode to extract the signal level of a pixel signal and holds the pixel data corresponding to the amount of received light by each of the sensor pixels 11. The column signal processing circuit 40 performs, for example, a CDS process in a malfunction detection mode to extract the signal level of a ramp voltage and holds the pixel data corresponding to the signal level of the ramp voltage. The column signal processing circuit 40 includes, for example, a plurality of ADCs (analog-digital conversion circuits) 40a. Each of the vertical signal lines 13 is provided with the one ADC 40a. The column signal processing circuit 40 converts analog pixel signals outputted from the respective sensor pixels 11 column by column into digital signals, for example, in the imaging mode and outputs the digital signals. The column signal processing circuit 40 converts an analog ramp signal outputted from DAC 51 into a digital signal, for example, in the malfunction detection mode and outputs the digital signal.

A voltage (ramp voltage $V_{ref}$) having a ramp waveform and a counter value change in a one-to-one relationship, thereby causing the ADC 40a to convert the potential (analog signal) of the vertical signal line 13 into a digital signal. The ADC 40a converts a voltage change in the ramp voltage $V_{ref}$ into a time change. The ADC 40a performs conversion into a digital value by counting the time in a certain cycle (clock).

The ADC 40a includes, for example, a comparator 41, a counter (illustrated as CNT in the diagram) 42, a transfer switch 43, and a memory 44. The comparator 41 corresponds to a specific example of an "output unit" of the present disclosure.

The comparator 41 compares a signal voltage $V_{sig}$ of the vertical signal line 13 corresponding to a pixel signal outputted from each of the sensor pixels 11 in the n-th column of the pixel array unit 10 and a voltage (ramp voltage $V_{ref}$) having a ramp waveform supplied from the voltage supply unit 50 in the imaging mode. The comparator 41 outputs "H" level, for example, in a case where the ramp voltage $V_{ref}$ is greater than the signal voltage $V_{sig}$. The comparator 41 outputs "L" level in a case where the ramp voltage $V_{ref}$ is less than or equal to the signal voltage $V_{sig}$.

In the imaging mode, a voltage $V_{sig}$ of the vertical signal line 13 has the value corresponding to the amount of received light by the sensor pixel 11.

In addition, the comparator 41 compares the signal voltage $V_{sig}$ of the vertical signal line 13 and the voltage (ramp voltage $V_{ref}$) having a ramp waveform supplied from the voltage supply unit 50 in the malfunction detection mode and outputs a result of the comparison. The comparator 41 outputs "H" level, for example, in a case where the ramp voltage $V_{ref}$ is greater than the signal voltage $V_{sig}$. The comparator 41 outputs "L" level in a case where the ramp voltage $V_{ref}$ is less than or equal to the signal voltage $V_{sig}$. In the malfunction detection mode, the voltage $V_{sig}$ of the vertical signal line 13 is fixed at a constant voltage. It is to be noted that the voltage $V_{sig}$ may be the voltage (power supply voltage Vdd) of the power supply line VDD.

The counter 42 is supplied with the clock CK from the system control circuit 60 at the same time as the DAC 51 under control by a control signal CS2. The counter 42 performs counting in synchronization with the clock CK. The control signal CS2 is supplied from the system control circuit 60. The counter 42 counts the clock CK, for example, during the period from the start of the comparison operation by the comparator 41 to the inversion of an output from the comparator 41.

The transfer switch 43 is turned on (closed) under control by a control signal CS3 when the counting operation of the counter 42 is finished. The transfer switch 43 transfers a count result of the counter 42 to the memory 44. The control signal CS3 is supplied from the system control circuit 60. In this way, analog signals supplied from the respective sensor pixels 11 column by column via the vertical signal lines 13 are converted into N-bit digital signals by the respective operations of the comparators 41 and the counters 42 in the ADCs 40a. The N-bit digital signals are each stored in the memory 44.

The column signal processing circuit 40 further includes, for example, a plurality of switches 45. The one switch 45 is allocated to each of the vertical signal lines 13. Each of the switches 45 corresponds to a specific example of a "switching unit" of the present disclosure. Each switch 45 couples and uncouples a wiring line to which a fixed voltage (e.g., power supply voltage Vdd) is applied and each vertical signal line 13 on the basis of a control signal CS4 supplied from the system control circuit 60. For example, in the imaging mode, turning off each switch 45 causes each switch 45 to cause a pixel signal of each vertical signal line 13 to have the value corresponding to the amount of received light by the sensor pixel 11. For example, in the malfunction detection mode, turning on each switch 45 causes each switch 45 to cause a pixel signal of each vertical signal line 13 to have a fixed value (e.g., power supply voltage Vdd). The column signal processing circuit 40 further includes, for example, a plurality of switches 46. Each of the switches 46 couples and uncouples the two vertical signal lines 13 adjacent to each other on the basis of the control signal CS4 supplied from the system control circuit 60. For example, in the imaging mode, turning off each switch 45 causes each switch 46 to separate pixel signals of the respective vertical signal lines 13 from each other. For example, in the malfunction detection mode, turning on each switch 45 causes each switch 46 to equalize pixel signals of the respective vertical signal lines 13.

The horizontal drive circuit 30 includes a shift register and the like. The horizontal drive circuit 30 controls the column address and the column scanning of the ADC 40a in the column signal processing circuit 40. Under control by this horizontal drive circuit 30, the N-bit digital signals subjected to AD conversion in the respective ADCs 40a are sequentially read out to the horizontal output line 47 and are outputted as imaging data via the horizontal output line 47.

The voltage supply unit 50 includes, for example, the DAC (digital-analog conversion circuit) 51 as a means for generating a voltage (ramp voltage $V_{ref}$) having a so-called ramp (RAMP) waveform whose level is varied gradiently with time. The DAC 51 generates the ramp voltage $V_{ref}$ on the basis of the clock CK supplied from the system control circuit 60 under control by a control signal CS1 supplied from the system control circuit 60 and supplies the ramp voltage $V_{ref}$ to the ADC 40a of the column signal processing circuit 40.

FIG. 4 illustrates a circuit configuration example of the DAC 51. FIG. 5 illustrates an output waveform example of the DAC 51. The DAC 51 includes a first current source 51a, a second current source 51b, a first shift register 51c, a second shift register 51d, and a resistor 51e. The resistor 51e is coupled to a wiring line 51f in series. The first shift register 51c corresponds to a specific example of a "control unit" of the present disclosure.

The first current source 51a generates a voltage having a step-shaped ramp waveform on the basis of control by the first shift register 51c. The first current source 51a is a N-bit current source DAC including a plurality of current sources A. The plurality of current sources A is coupled to the wiring line 51f in parallel via switches. FIG. 4 exemplifies current sources $A_0, A_1, A_2, \ldots, A_i, \ldots A_{2m-3}, A_{2m-2}$, and $A_{2m-1}$ as the plurality of current sources A. The current values of the respective current sources $A_0, A_1, A_2, \ldots, A_i, \ldots, A_{2m-3}, A_{2m-2}$, and $A_{2m-1}$ are indicated near the respective current sources $A_0, A_1, A_2, \ldots, A_i, \ldots A_{2m-3}, A_{2m-2}$, and $A_{2m-1}$ in FIG. 4.

The second current source 51b corrects the voltage having a step-shaped ramp waveform generated by the first current source 51a as a voltage having a ramp waveform with small steps on the basis of control by the second shift register 51d. The second current source 51b is a M-bit current source DAC including a plurality of current sources B. The plurality of current sources B has smaller current values than those of the current sources A. The plurality of current sources B is coupled to a wiring line 51g in parallel via switches. The wiring line 51g is coupled to the wiring line 51f. FIG. 4 exemplifies current sources $B_1, B_2, \ldots$, and $B_n$ as the plurality of current sources B. The current values of the respective current sources $B_1, B_2, \ldots$, and $B_n$ are indicated near the respective current sources $B_1, B_2, \ldots$, and $B_n$ in FIG. 4.

In the wiring line 51g, an output terminal 51h of the DAC 51 is coupled between the portion at which the wiring line 51g and the wiring line 51f are coupled and the resistor 51e. This causes the resistor 51e to function as an I-V converter that converts currents (ramp currents) supplied from the first current source 51a and the second current source 51b into voltages (ramp voltages).

The first current source 51a and the second current source 51b generate a voltage having a first-phase waveform and a voltage having a second-phase waveform in the imaging mode in accordance with control by the first shift register 51c and the second shift register 51d. The voltage having the first-phase waveform is generated, for example, in a case where the potential of the floating diffusion FD is read out from each of the vertical signal lines 13. The potential of the floating diffusion FD is obtained by resetting the potential of the floating diffusion FD of each of the sensor pixels 11 in the n-th column at a predetermined potential. The voltage having the second-phase waveform is generated, for example, in a case where the voltage corresponding to the level of electric charges is read out from each of the vertical signal lines 13. The electric charges are accumulated in the floating diffusion FD by being transferred from the photodiode PD to the floating diffusion FD after the floating diffusion FD of each of the sensor pixels 11 in the n-th column is reset at a predetermined potential. In the imaging mode, the voltage having the first-phase waveform is generated by the plurality of current sources A included in the first current source 51a and the plurality of current sources B included in the second current source 51b.

The first current source M a and the second current source Mb generate a voltage having the first-phase waveform and a voltage having the second-phase waveform, for example, as illustrated in FIG. 5 in the malfunction detection mode in accordance with control by the first shift register M c and the second shift register Md. In this way, in the present embodiment, the first current source 51a and the second current source Mb generate the voltage having the first-phase waveform and the voltage having the second-phase waveform even in the malfunction detection mode as in the imaging mode. The voltages having the first-phase waveform and the voltages having the second-phase waveform are, however, different from each other in use in the imaging mode and the malfunction detection mode. Thus, the first-phase waveform and the second-phase waveform in the malfunction detection mode are respectively different from the first-phase waveform and the second-phase waveform in the imaging mode.

In the malfunction detection mode, a voltage having the first-phase waveform is generated by the plurality of current sources A belonging to one (first group) of two groups (a first group and a second group) and the plurality of current sources B belonging to the second current source 51b. The plurality of current sources A included in the first current source 51a is divided into the two groups (the first group and the second group). The plurality of current sources A belonging to the first group corresponds to specific examples of "first group current sources" of the present disclosure. The plurality of current sources A belonging to the second group corresponds to specific examples of "second group current sources" of the present disclosure.

A voltage having the second-phase waveform is generated by the plurality of current sources A belonging to one group (first group) of two groups (a first group and a second group), the one current source A (test target current source $A_{test}$ in the diagram) belonging to the second group, and the plurality of current sources B belonging to the second current source 51b. The plurality of current sources A included in the first current source 51a is divided into the two groups (the first group and the second group). In the malfunction detection mode, the peak value of the voltage having the second-phase waveform is thus higher than the peak value of the voltage having the first-phase waveform by a voltage ($\Delta V_{ref}$) generated by the test target current source $A_{test}$.

Here, an output from the comparator 41 obtained by inputting a voltage having the first-phase waveform to the comparator 41 is compared with an output from the comparator 41 obtained by inputting a voltage having the second-phase waveform to the comparator 41. As illustrated in FIG. 5, the period from the start of a comparison operation by the comparator 41 to the inversion of an output from the comparator 41 is represented as T1 on the first-phase waveform and the period from the start of a comparison operation by the comparator 41 to the inversion of an output from the comparator 41 is represented as T2 on the second-phase waveform. The period T2 is then longer by a period $\Delta T$ corresponding to the voltage ($\Delta V_{ref}$) generated by the test target current source $A_{test}$. The period $\Delta T$ is converted into a digital value $D_{test}$ by the counter 42.

FIG. 6 illustrates a circuit configuration example of the first shift register 51c. FIG. 6 exemplifies the state of a mode (that is referred to as "first malfunction detection mode" below) for detecting a malfunction of each of the current sources A belonging to the first group described above. The first shift register 51c controls the driving of each of the current sources A belonging to the first group described above to generate a first-phase ramp voltage and controls the driving of each of the current sources A belonging to the first group described above and at least one current source A of the plurality of current sources A belonging to the second group described above to generate a second-phase ramp voltage. The first shift register 51c includes, for example, a plurality of shift registers SR that controls the driving of the respective current sources A belonging to the first group described above and a plurality of shift registers SR that controls the driving of the respective current sources A belonging to the second group described above.

FIG. 6 exemplifies shift registers $SR_o$, $SR_1$, ..., and $SR_{m-1}$ as the plurality of shift registers SR that controls the first group described above and exemplifies the shift registers $SR_m$, $SR_{m+1}$, ..., and $SR_{2m-1}$ as the plurality of shift registers SR that controls the second group described above. Outputs $Q_o$, $Q_1$, ..., and $Q_{m-1}$ from respective Q terminals are controlled by control signals $S_o$, $S_1$, ..., and $S_{m-1}$ and a control signal IN2 in the shift registers $SR_o$, $SR_1$, ..., and $SR_{m-1}$. The Q terminals perform on/off control on the respective switches coupled to the first group described above. Outputs $Q_m$, $Q_{m+1}$, ..., and $Q_{2m-1}$ from the respective Q terminals are controlled by control signals $S_m$, $S_{m+1}$, ..., and $S_{2m-1}$ and an output from the logic circuit Lo in the 32 shift registers $SR_m$, $SR_{m+1}$, ..., and $SR_{2m-1}$. The Q terminals perform on/off control on the respective switches coupled to the second group described above. A wiring line to which the control signal IN2 is inputted is coupled to the first stage (e.g., $SR_o$) of the plurality of shift registers SR that controls the driving of the respective current sources A belonging to the first group described above.

The first shift register 51c further includes a logic circuit Lo between the final stage (e.g., $SR_{m-1}$) of the plurality of shift registers SR that controls the first group described above and the first stage (e.g., $SR_m$) of the plurality of shift registers SR that controls the second group described above. The logic circuit Lo is, for example, a multiplexer circuit. One of the input terminals of the multiplexer circuit is coupled to the Q terminal of the final stage (e.g., $SR_{m-1}$) of the plurality of shift registers SR that controls the first group described above. The other input terminal of the multiplexer circuit is coupled to a wiring line to which a control signal IN1 is inputted. The output terminal of the multiplexer circuit is coupled to the first stage (e.g., $SR_m$) of the plurality of shift registers SR that controls the second group described above.

In a case where a Q terminal has an output of 0 ("L" level), the switch of the first current source 51a is turned on. In a case where the Q terminal has an output of 1 ("H" level), the switch of the first current source 51a is turned off. In a case where 1 ("H" level) is inputted to an XS terminal, the Q terminal has an output of 1 ("H" level). In a case where 0 ("L" level) is inputted to the XS terminal, the Q terminal has an output of 0 ("L" level).

In a case of the first malfunction detection mode and a first-phase waveform generation mode, the system control circuit 60 controls the plurality of shift registers SR (e.g., $SR_0$ to $SR_{m-1}$) that controls the first group described above to cause 1 ("H" level) to be outputted from the Q terminals of the plurality of respective shift registers SR (e.g., $SR_0$ to $SR_{m-1}$) that controls the first group described above. This turns off voltage outputs from the first group described above.

In a case of the first malfunction detection mode and the first-phase waveform generation mode, the system control circuit 60 controls the plurality of shift registers SR (e.g., $SR_m$ to $SR_{2m-1}$) that controls the second group described above to cause outputs from the Q terminals to sequentially switch from 0 ("L" level) to 1 ("H" level) whenever clocks CK are inputted to the plurality of respective shift registers SR (e.g., $SR_m$ to $SR_{2m-1}$) that controls the second group described above. This causes the second group described above to output a ramp voltage (voltage having the first-phase waveform illustrated in FIG. 7).

In a case of the first malfunction detection mode and a second-phase waveform generation mode, the system control circuit 60 selects the shift register $SR_{test}$ from the plurality of shift registers SR (e.g., $SR_0$ to $SR_{m-1}$) that controls the first group described above. The system control circuit 60 controls the shift register $SR_{test}$ to cause 0 ("L" level) to be outputted from the Q terminal of the shift register $SR_{test}$. The system control circuit 60 further controls the plurality of shift registers SR that controls the first group to cause 1 ("H" level) to be outputted from the Q terminals of the plurality of shift registers SR that controls the first group except for the shift register $SR_{test}$. The second-phase waveform may therefore include a voltage output (bottom portion of the second-phase waveform in FIG. 7) from the current source (test target current source $A_{test}$) corresponding to the shift register $SR_{test}$.

In a case of the first malfunction detection mode and the second-phase waveform generation mode, the system control circuit 60 controls the plurality of shift registers SR (e.g., $SR_m$ to $SR_{2m-1}$) that controls the first group described above to cause outputs from the Q terminals to sequentially switch from 0 ("L" level) to 1 ("H" level) whenever the clocks CK are inputted to the plurality of respective shift registers SR (e.g., $SR_m$ to $SR_{2m-1}$) that controls the second group described above. This causes the second group described above to output a ramp voltage (portion other than the bottom of the second-phase waveform illustrated in FIG. 7).

FIG. 8 illustrates a circuit configuration example of the first shift register 51c. FIG. 8 exemplifies the state of a mode (that is referred to as "second malfunction detection mode" below) for detecting a malfunction of each of the current sources A belonging to the second group described above.

In a case of the second malfunction detection mode and the first-phase waveform generation mode, the system control circuit 60 controls the plurality of shift registers SR (e.g., $SR_m$ to $SR_{2m-1}$) that controls the second group described above to cause 1 ("H" level) to be outputted from the Q terminals of the plurality of respective shift registers SR (e.g., $SR_m$ to $SR_{2m-1}$) that controls the second group described above. This turns off voltage outputs from the second group described above.

In a case of the second malfunction detection mode and the first-phase waveform generation mode, the system control circuit 60 controls the plurality of shift registers SR (e.g., $SR_0$ to $SR_{m-1}$) that controls the first group described above to cause outputs from the Q terminals to sequentially switch from 0 ("L" level) to 1 ("H" level) whenever the clocks CK are inputted to the plurality of respective shift registers SR (e.g., $SR_0$ to $SR_{m-1}$) that controls the first group described above. This causes the first group described above to output a ramp voltage (voltage having the first-phase waveform illustrated in FIG. 9).

In a case of the second malfunction detection mode and the second-phase waveform generation mode, the system control circuit 60 selects the shift register $SR_{test}$ from the plurality of shift registers SR (e.g., $SR_m$ to $SR_{2m-1}$) that controls the second group described above. The system control circuit 60 controls the shift register $SR_{test}$ to cause 0 ("L" level) to be outputted from the Q terminal of the shift register $SR_{test}$. The system control circuit 60 further controls the plurality of shift registers SR that controls the second group to cause 1 ("H" level) to be outputted from the Q terminals of the plurality of shift registers SR that controls the second group except for the shift register $SR_{test}$. The second-phase waveform may therefore include a voltage output (bottom portion of the second-phase waveform in FIG. 9) from the current source (test target current source $A_{test}$) corresponding to the shift register $SR_{test}$.

In a case of the second malfunction detection mode and the second-phase waveform generation mode, the system control circuit 60 controls the plurality of shift registers SR (e.g., $SR_0$ to $SR_{m-1}$) that controls the first group described above to cause outputs from the Q terminals to sequentially switch from 0 ("L" level) to 1 ("H" level) whenever the clocks CK are inputted to the plurality of respective shift registers SR (e.g., $SR_0$ to $SR_{m-1}$) that controls the first group described above. This causes the first group described above to output a ramp voltage (portion other than the bottom of the second-phase waveform illustrated in FIG. 9).

In a case of the first malfunction detection mode and the first-phase waveform generation mode, the comparator 41 compares the signal voltage $V_{sig}$ having a fixed value and the voltage (ramp voltage $V_{ref}$) having the ramp waveform generated by each of the current sources A (e.g., $A_m$ to $A_{2m-1}$) belonging to the second group described and outputs a result of the comparison. In a case of the first malfunction detection mode and the second-phase waveform generation mode, the comparator 41 compares the signal voltage $V_{sig}$ having a fixed value and the voltage (ramp voltage $V_{ref}$) having the ramp waveform generated by each of the current sources A (e.g., $A_m$ to $A_{2m-1}$) belonging to the second group described and at least one current source A (test target current source $A_{test}$) of the plurality of current sources A belonging to the first group described above and outputs a result of the comparison.

In a case of the second malfunction detection mode and the first-phase waveform generation mode, the comparator 41 compares the signal voltage $V_{sig}$ having a fixed value and the voltage (ramp voltage $V_{ref}$) having the ramp waveform generated by each of the current sources A (e.g., $SR_0$ to $SR_{m-1}$) belonging to the first group described and outputs a result of the comparison. In a case of the second malfunction detection mode and the second-phase waveform generation mode, the comparator 41 compares the signal voltage $V_{sig}$ having a fixed value and the voltage (ramp voltage $V_{ref}$) having the ramp waveform generated by each of the current sources A belonging to the first group described and at least one current source A (test target current source $A_{test}$) of the plurality of current sources A belonging to the second group described above and outputs a result of the comparison.

The malfunction detection unit 70 determines the presence or absence of a malfunction of the DAC 51 in the malfunction detection mode. The malfunction detection unit 70 determines whether or not an output (digital value $D_{test}$) from the logic circuit falls within the range between an upper limit value D1 and a lower limit value D2. As a result, in a case where the digital value $D_{test}$ falls within the range between the upper limit value D1 and the lower limit value D2, the malfunction detection unit 70 determines that the test target current source $A_{test}$ has no malfunction (Pass determination). In a case where the digital value $D_{test}$ goes beyond the range between the upper limit value $D_1$ and the lower limit value $D_2$, the malfunction detection unit 70 determines that the test target current source $A_{test}$ has a malfunction (Fail determination). The malfunction detection unit 70 outputs a result of the determination to the outside.

The malfunction detection unit 70 detects a malfunction of at least one current source A of the plurality of current sources A belonging to the first group described above on the basis of a result (digital value $D_{test}$) of the comparison by the comparator 41 in the first malfunction detection mode. The malfunction detection unit 70 detects a malfunction of at least one current source A of the plurality of current sources A belonging to the second group described above on the basis of a result (digital value $D_{test}$) of the comparison by the comparator 41 in the second malfunction detection mode.

[Operation]

Next, a malfunction detection operation by the imaging device 1 according to the present embodiment is described with reference to FIG. 10. First, the imaging device 1 is set at the first malfunction detection mode. Subsequently, the imaging device 1 sets the current source $A_0$ as the test target current source $A_{test}$ and forms a voltage having the first-phase ramp waveform and a voltage having the second-phase ramp waveform (step S101). The imaging device 1 then determines whether or not an output (digital value $D_{test}$) from the logic circuit falls within the range between the upper limit value D1 and the lower limit value D2 (step S102). As a result, in a case where the digital value $D_{test}$ falls within the range between the upper limit value D1 and the lower limit value D2, the imaging device 1 determines that the test target current source $A_{test}$ has no malfunction (Pass determination) (step S103). In a case where the digital value $D_{test}$ goes beyond the range between the upper limit value $D_1$ and the lower limit value $D_2$, the malfunction detection unit 70 determines that the test target current source $A_{test}$ has a malfunction (Fail determination) (step S104).

Next, the imaging device 1 determines whether or not a test on the current source $A_{m-1}$ is finished (step S105). In a case where the test on the current source $A_{m-1}$ is not finished, the imaging device 1 switches the test target current source $A_{test}$ (step S106). After that, the imaging device 1 executes step S102. The imaging device 1 sequentially switches the current sources $A_1, A_2, \ldots$ as the test target current source $A_{test}$ and carries out tests. In a case where the test on the current source $A_{m-1}$ is finished, the imaging device 1 sets the current source $A_m$ as the test target current source $A_{test}$ and forms the first-phase ramp waveform and the second-phase ramp waveform (step S107).

The imaging device 1 then determines whether or not an output (digital value $D_{test}$) from the logic circuit falls within the range between the upper limit value D1 and the lower limit value D2 (step S108). As a result, in a case where the digital value $D_{test}$ falls within the range between the upper limit value D1 and the lower limit value D2, the imaging device 1 determines that the test target current source $A_{test}$ has no malfunction (Pass determination) (step S109). In a case where the digital value $D_{test}$ goes beyond the range between the upper limit value $D_1$ and the lower limit value $D_2$, the malfunction detection unit 70 determines that the test target current source $A_{test}$ has a malfunction (Fail determination) (step S110).

Next, the imaging device 1 determines whether or not a test on the current source $A_{2m-1}$ is finished (step S111). In a case where the test on the current source $A_{2m-1}$ is not finished, the imaging device 1 switches the test target current source $A_{test}$ (step S112). After that, the imaging device 1 executes step S102. The imaging device 1 sequentially switches the current sources $A_{m+1}, A_{m+2}, \ldots$ as the test target current source $A_{test}$ and carries out tests. In a case where the test on the current source $A_{2m-1}$ is finished, the imaging device 1 outputs a result of the determination (step S113).

Effects

Next, effects of the imaging device 1 according to the present embodiment are described.

ADC mounted on an image sensor includes single-slope ADC. DAC is frequently used for this single-slope ADC as a ramp voltage generator. An example of DAC architecture includes current segment DAC including several hundreds of current sources. In the current segment DAC, currents generated by performing selective on/off control on the several hundreds of current source flow through resistors, thereby offering a ramp voltage.

In a case of use where DAC is not allowed to have a malfunction, it is necessary to carry out tests to determine whether several hundreds of current sources each have a malfunction. In general, these tests are carried out at the time of shipment of an image sensor. These tests have been carried out in the past by inputting voltages obtained from the individual current sources to an external inspection device. However, in a case where the voltages obtained from the individual current sources are inputted to the external inspection device, the influence of parasitic RC, a process for increasing the measurement accuracy, or the like tends to increase the test time.

In contrast, in the present embodiment, a malfunction of at least one current source A of the current sources A in one of the groups is detected on the basis of a result of the comparison between the first-phase ramp voltage and the second-phase ramp voltage. This makes it possible to detect a malfunction of the imaging device even without using an external inspection device. In addition, there is no need to use the external inspection device. This also makes it possible to omit the influence of parasitic RC, the process for increasing the measurement accuracy, or the like. As a result, it is possible to shorten the test time.

2. Modification Example

In the embodiment described above, the malfunction detection unit 70 is built in the imaging device 1. However, for example, as illustrated in FIG. 11, a malfunction detection unit 2 having a function similar to that of the malfunction detection unit 70 may be provided separately from the imaging device 1.

In the embodiment described above and the modification example thereof, the plurality of current sources A included in the first current source 51*a* is divided into two groups. The plurality of current sources A may be, however, divided into three or more groups. In addition, in the embodiment described above and the modification example thereof, an output from the test target current source $A_{test}$ is included in the second-phase waveform. An output from the test target current source $A_{test}$ may be, however, included in the first-phase waveform.

3. Application Example

FIG. 12 illustrates an example of a circuit configuration of an imaging system 3 including the imaging device 1 according to the embodiment described above.

The imaging system 3 includes, for example, an electronic apparatus including an imaging device such as a digital still camera or a video camera, or a mobile terminal device such as a smartphone or a tablet terminal. The imaging system 3 includes, for example, the imaging device 1 according to the embodiment described above, a DSP circuit 141, a frame memory 142, a display unit 143, a storage unit 144, an operation unit 145, and a power supply unit 146. In the imaging system 3, the imaging device 1 according to the embodiment described above, the DSP circuit 141, the frame memory 142, the display unit 143, the storage unit 144, the operation unit 145, and the power supply unit 146 are coupled to each other via a bus line 147.

The imaging device 1 according to the embodiment described above outputs image data (output signal Vout) corresponding to incident light. The imaging device 1 according to the embodiment described above further makes a malfunction determination for the DAC 51 and outputs a result of the determination. The DSP circuit 141 is a signal processing circuit that processes the output signal Vout that is outputted from the imaging device 1 according to the embodiment described above. The frame memory 142 temporarily holds image data processed by the DSP circuit 141 on a frame-by-frame basis. The display unit 143 includes, for example, a panel type display such as a liquid crystal panel or an organic EL (Electro Luminescence) panel. The display unit 143 displays a moving image or a still image captured by the imaging device 1 according to the embodiment described above. The storage unit 144 stores image data of the moving image or the still image captured by the imaging device 1 according to the embodiment described above in a recording medium such as a semiconductor memory or a hard disk. The operation unit 145 issues an operation instruction about a variety of functions of the imaging system 3 in accordance with an operation by a user. The power supply unit 146 appropriately supplies various kinds of power to these targets of supply. The various kinds of power serve as operation power supplies for the imaging device 1 according to the embodiment described above, the DSP circuit 141, the frame memory 142, the display unit 143, the storage unit 144, and the operation unit 145.

FIG. 13 illustrates an example of a circuit configuration of an imaging system 4 including the imaging device 1 and the malfunction detection unit 2 according to the modification example described above.

The imaging system 4 includes, for example, an electronic apparatus including an imaging device such as a digital still camera or a video camera, or a mobile terminal device such as a smartphone or a tablet terminal. The imaging system 4 includes, for example, the imaging device 1 according to the modification example described above, the DSP circuit 141, the frame memory 142, the display unit 143, the storage unit 144, the operation unit 145, the power supply unit 146, and the malfunction detection unit 2 according to the modification example described above. In the imaging system 3, the imaging device 1 according to the modification example described above, the DSP circuit 141, the frame memory 142, the display unit 143, the storage unit 144, the operation unit 145, the power supply unit 146, and the malfunction detection unit 2 are coupled to each other via the bus line 147.

The imaging device 1 according to the modification example described above outputs image data (output signal Vout) corresponding to incident light. The malfunction detection unit 2 according to the modification example described above further makes a malfunction determination for the DAC 51 and outputs a result of the determination. The DSP circuit 141 is a signal processing circuit that processes the output signal Vout that is outputted from the imaging device 1 according to the modification example described above. The frame memory 142 temporarily holds image data processed by the DSP circuit 141 on a frame-by-frame basis. The display unit 143 includes, for example, a panel type display such as a liquid crystal panel or an organic EL panel. The display unit 143 displays a moving image or a still image captured by the imaging device 1 according to the modification example described above. The storage unit 144 stores image data of the moving image or the still image captured by the imaging device 1 according to the embodiment described above in a recording medium such as a semiconductor memory or a hard disk. The operation unit 145 issues an operation instruction about a variety of functions of the imaging system 3 in accordance with an operation by a user. The power supply unit 146 appropriately supplies various kinds of power to these targets of supply. The various kinds of power serve as operation power supplies for the imaging device 1 according to the embodiment described above, the DSP circuit 141, the frame memory 142, the display unit 143, the storage unit 144, and the operation unit 145.

Next, an example of an imaging procedure by each of the imaging systems 3 and 4 is described.

FIG. 14 illustrates an example of a flowchart of an imaging operation by each of the imaging systems 3 and 4. A user operates the operation unit 145 to issue an instruction to start imaging (step S201). The operation unit 145 then transmits an imaging instruction to the imaging device 1 (step S202). In the imaging system 3, the imaging device 1 makes a malfunction determination for the DAC 51 upon receiving the imaging instruction (step S203). In the imaging system 4, the malfunction detection unit 2 makes a malfunction determination for the DAC 51 (step S203). In a case where the DAC 51 has no malfunction, the imaging device 1 executes imaging in a predetermined imaging scheme (step S204).

The imaging device 1 outputs image data obtained by the imaging to the DSP circuit 141. Here, the image data is data of pixel signals of all pixels generated on the basis of electric charges temporarily held in the floating diffusions FD. The DSP circuit 141 performs predetermined signal processing (e.g., noise reduction process or the like) on the basis of the image data inputted from the imaging device 1 (step S205). The DSP circuit 141 causes the frame memory 142 to hold the image data subjected to the predetermined signal processing and the frame memory 142 causes the storage unit 144 to store the image data (step S206). In this way, imaging is performed by each of the imaging systems 3 and 4.

In the present application example, the imaging device 1 according to any of the respective embodiments described above and the modification example thereof is applied to each of the imaging systems 3 and 4. This prevents the imaging device 1 from being kept in use without notifying a user that the imaging device 1 has a malfunction. It is thus possible to use the imaging device 1 even in a case of use where the imaging device 1 is not allowed to have a malfunction.

In the present application example, a malfunction determination is made for the DAC 51 before imaging, but a malfunction determination may be made for the DAC 51 at the time of shipment of the imaging device 1.

4. Practical Application Example

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 and the imaging sections 12101 to 12104 among the components described above. The application of the technology according to the present disclosure to the imaging section 12031 and the imaging sections 12101 to 12104 makes it possible to achieve a vehicle control system at low cost. The vehicle control system is less likely to have the malfunctioning imaging section 12031 or imaging sections 12101 to 12104.

Although the present disclosure has been described above with reference to the embodiment, the modification example thereof, the application example thereof, and the practical application example thereof, the present disclosure is not limited to the embodiment and the like. It is possible to make a variety of modifications. It is to be noted that the effects described herein are merely illustrative. The effects of the present disclosure are not limited to the effects described herein. The present disclosure may have effects other than the effects described herein.

In addition, for example, it is possible to configure the present disclosure as follows.

(1)

An imaging device including:
a plurality of current sources including first group current sources and second group current sources; and
a control unit that controls driving of the first group current sources to generate a first-phase ramp voltage and controls driving of the first group current sources and at least one current source of the second group current sources to generate a second-phase ramp voltage.

(2)

The imaging device according to (1), further including:
a switching unit that switches a pixel signal to a value corresponding to an amount of received light by a sensor pixel in an imaging mode and switches a pixel signal to a fixed value in a malfunction detection mode; and
an output unit that compares the pixel signal and a ramp voltage generated by the first group current sources and compares the pixel signal and a ramp voltage generated by the second group current sources and outputs results of these comparisons in the malfunction detection mode.

(3)

The imaging device according to (2), further including a malfunction detection unit that detects a malfunction of at least one current source of the second group current sources in the malfunction detection mode on the basis of the results of the comparisons.

(4)

The imaging device according to any one of (1) to (3), in which the control unit includes
first group shift registers that control the driving of the first group current sources,
second group shift registers that control the driving of the second group current sources, and
a logic circuit including input terminals that are coupled to a Q terminal of a final stage of the first group shift registers and a wiring line to which a control signal is inputted and an output terminal to which a first stage of the second group shift registers is coupled.

(5)

An imaging system including:
a plurality of current sources including first group current sources and second group current sources;
a control unit that controls driving of the first group current sources to generate a first-phase ramp voltage and controls driving of the first group current sources and at least one current source of the second group current sources to generate a second-phase ramp voltage; and
a malfunction detection unit that detects a malfunction of at least one current source of the second group current sources on the basis of the first-phase ramp voltage and the second-phase ramp voltage.

The imaging device and the imaging system according to the respective embodiments of the present disclosure each makes it is possible to detect a malfunction of the imaging device without using the external inspection device. This makes it possible to omit the influence of parasitic RC, the process for increasing the measurement accuracy, or the like. It is thus possible to shorten the test time. It is to be noted that the effects of the present disclosure are not necessarily limited to the effects described here, but may include any of the effects described herein.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising:
a ramp signal generator configured to generate a ramp signal;

a comparator configured to compare a voltage based on the ramp signal with a fixed voltage and output a result of the comparison;

malfunction detection circuitry configured to perform a malfunction detection of the ramp signal generator based on the result of the comparison and output a result of the malfunction detection, wherein the ramp signal generator comprises a plurality of current sources, and the malfunction detection circuitry is configured to detect a malfunction of at least one of the plurality of current sources.

2. The imaging device according to claim 1, further comprising:

a controller, wherein the ramp signal comprises a first-phase ramp voltage and a second-phase ramp voltage, the plurality of current sources comprises first group current sources and second group current sources, the controller is configured to control the first group current sources to generate the first-phase ramp voltage and to control the first group current sources and at least one current source of the second group current sources to generate the second-phase ramp voltage, and the comparator is configured to compare the first-phase ramp voltage with the fixed voltage and to compare the second-phase ramp voltage with the fixed voltage.

3. The imaging device according to claim 2, wherein the malfunction detection circuitry is configured to detect a malfunction of the at least one current source of the second group current sources based on results of the comparisons.

4. The imaging device according to claim 1, further comprising:

a communication interface configured to communicate with a vehicular electronic control unit (ECU).

5. The imaging device according to claim 1, wherein the ramp signal includes a first ramp voltage and a second ramp voltage;

the comparator compares voltages based on the first ramp voltage and the second ramp voltage with the fixed voltage to produce the output; and the malfunction detection circuitry performs the malfunction detection based on the output of the comparator.

6. An imaging device comprising:

a pixel array having a plurality of pixels;

a ramp signal generator configured to generate a ramp signal;

a comparator configured to compare a pixel signal output from at least one of the plurality of pixels with the ramp signal;

malfunction detection circuitry configured to perform a malfunction detection of the ramp signal generator and output a result of the malfunction detection, wherein the ramp signal generator comprises a plurality of current sources, and the malfunction detection circuitry is configured to detect a malfunction of at least one of the plurality of current sources.

7. The imaging device according to claim 6, further comprising:

a controller, wherein the ramp signal comprises a first-phase ramp voltage and a second-phase ramp voltage, the plurality of current sources comprises first group current sources and second group current sources, the controller is configured to control the first group current sources to generate the first-phase ramp voltage and to control the first group current sources and at least one current source of the second group current sources to generate the second-phase ramp voltage, and the comparator is configured to compare the first-phase ramp voltage with the fixed voltage and to compare the second-phase ramp voltage with the fixed voltage.

8. The imaging device according to claim 7, wherein the malfunction detection circuitry is configured to detect a malfunction of the at least one current source of the second group current sources based on results of the comparisons.

9. The imaging device according to claim 6, wherein in an imaging mode, the comparator is configured to compare the pixel signal with the ramp signal, and in a malfunction detection mode, the comparator is configured to compare the ramp signal with the fixed voltage.

10. The imaging device according to claim 9, further comprising:

switching circuitry configured to provide the pixel signal to the comparator in the imaging mode and to provide the fixed voltage to the comparator in the malfunction detection mode.

11. The imaging device according to claim 6, further comprising:

a communication interface configured to communicate with a vehicular electronic control unit (ECU).

12. The imaging device according to claim 6, wherein the ramp signal includes a first ramp voltage and a second ramp voltage;

the comparator compares voltages based on the first ramp voltage and the second ramp voltage with the fixed voltage to produce the output; and the malfunction detection circuitry performs the malfunction detection based on the output of the comparator.

* * * * *